United States Patent
Onishi et al.

(10) Patent No.: US 7,335,596 B2
(45) Date of Patent: Feb. 26, 2008

(54) METHOD FOR FABRICATING COPPER-BASED INTERCONNECTIONS FOR SEMICONDUCTOR DEVICE

(75) Inventors: Takashi Onishi, Kobe (JP); Tatsuya Yasunaga, Kobe (JP); Hideo Fujii, Kobe (JP); Tetsuya Yoshikawa, Takasago (JP); Jun Munemasa, Takasago (JP)

(73) Assignee: Kobe Steel, Ltd., Kobe-shi (JP)

( * ) Notice: Subject to any disclaimer, the term of this patent is extended or adjusted under 35 U.S.C. 154(b) by 280 days.

(21) Appl. No.: 11/157,862

(22) Filed: Jun. 22, 2005

(65) Prior Publication Data

US 2006/0019496 A1 Jan. 26, 2006

(30) Foreign Application Priority Data

Jul. 26, 2004 (JP) .............................. 2004-217761

(51) Int. Cl.
*H01L 21/44* (2006.01)
(52) U.S. Cl. ...................... 438/687; 438/660; 438/663; 257/E21.476
(58) Field of Classification Search ................ 438/660, 438/663, 687; 257/E21.476
See application file for complete search history.

(56) References Cited

U.S. PATENT DOCUMENTS

| | | | |
|---|---|---|---|
| 6,121,141 A * | 9/2000 | Woo et al. | 438/687 |
| 6,306,756 B1 * | 10/2001 | Hasunuma et al. | 438/632 |
| 6,323,120 B1 * | 11/2001 | Fujikawa et al. | 438/629 |
| 6,376,375 B1 * | 4/2002 | Hewitt-Bell et al. | 438/687 |
| 6,423,637 B2 | 7/2002 | Kim | |
| 6,451,682 B1 * | 9/2002 | Fujikawa et al. | 438/618 |
| 2002/0001950 A1 | 1/2002 | Kim | |
| 2003/0129832 A1 * | 7/2003 | Fujikawa et al. | 438/660 |
| 2003/0201536 A1 * | 10/2003 | Ueno | 257/750 |

FOREIGN PATENT DOCUMENTS

| | | |
|---|---|---|
| JP | 5-211238 | 8/1993 |
| JP | 10-79428 | 3/1998 |
| JP | 2000-200789 | 7/2000 |
| JP | 2001-7050 | 1/2001 |
| KR | 2000-0035140 | 6/2000 |
| KR | 2002-0002084 | 1/2002 |

OTHER PUBLICATIONS

Takao Fujikawa, et al., "Hydrogen Promoted Copper Migration in the High Pressure Anneal Process", Jpn. J. Appl. Phys., vol. 40 (2001), Part 1, No. 4A, Apr. 2001, pp. 2191-2196.
U.S. Appl. No. 11/157,862, filed Jun. 22, 2005, Onishi et al.
U.S. Appl. No. 11/229,721, filed Sep. 20, 2005, Mizuno et al.

* cited by examiner

*Primary Examiner*—Michael Lebentritt
*Assistant Examiner*—Angel Roman
(74) *Attorney, Agent, or Firm*—Oblon, Spivak, McClelland, Maier & Neustadt, P.C.

(57) ABSTRACT

Cu-based interconnections are fabricated in a semiconductor device by depositing a thin film of Cu or Cu alloy on a dielectric film by sputtering, the dielectric film having trenches and/or via holes at least one groove and being arranged on or above a substrate, and carrying out high temperature and high pressure treatment to thereby embed the Cu or Cu alloy into the trenches and/or via holes, in which the sputtering is carried out at a substrate temperature of −20° C. to 0° C. using, as a sputtering gas, a gaseous mixture containing hydrogen gas and an inert gas in a ratio in percentage of 5:95 to 20:80.

6 Claims, 4 Drawing Sheets

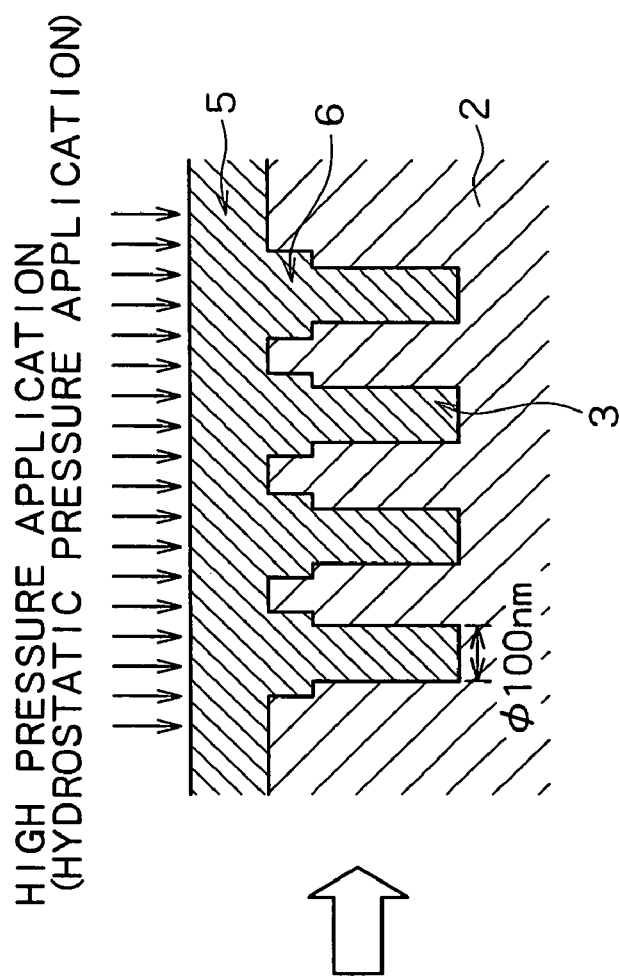
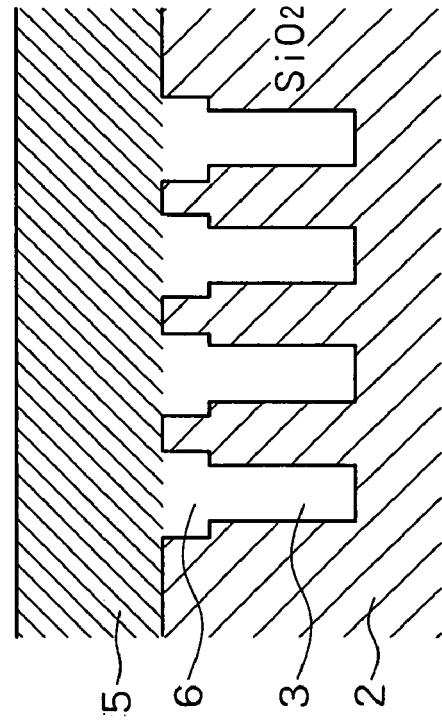

METHOD FOR FABRICATING COPPER-BASED INTERCONNECTIONS FOR SEMICONDUCTOR DEVICE

BACKGROUND OF THE INVENTION

1. Field of the Invention

The present invention relates to a method for fabricating interconnections of pure Cu or a Cu alloy (hereinafter generically referred to as "Cu-based metal") in semiconductor devices. Specifically, it relates to a method for fabricating Cu-based interconnections in semiconductor devices, such as Si semiconductor devices, typified by ultra-large scale integrated circuits (ULSI) by fabricating a thin film of a Cu-based metal on a groove, such as a via hole or a trench, arranged in a dielectric film by sputtering (physical vapor deposition), and embedding the Cu-based metal into the groove by reflowing at high temperature and high pressure to thereby fabricate the Cu-based interconnection.

2. Description of the Related Art

The design rule of semiconductor devices such as large-scale integrated circuits (LSIs) has more and more reduced shrank for larger packing densities and higher-speed signal transmission. The interconnection pitch, width and interval between interconnections, for example, have more and more reduced. These techniques mainly aim at faster devices. Such a device, however, has an increased interconnection resistance with a decreasing size and an increasing packing density of its interconnection circuit, and the increased interconnection resistance causes delay of signal transmission. To avoid this, interconnection materials having a lower electric resistance have been proposed. Namely, Cu-based materials have been used as interconnections, since such Cu-based materials have a lower electric resistance than conventional Al-based interconnection materials.

For larger packing densities and higher capabilities, the Cu-based interconnection is designed to have a multilayer structure, for example, by a damascene interconnection process (e.g., Japanese Patent Application Laid-Open (JP-A) No. 10-79428). In the damascene process, for example, an interlayer dielectric film typically of silicon oxide or silicon nitride is deposited on a semiconductor substrate, interconnection grooves such as trenches and via holes for embedded interconnection, and interlayer contact holes are deposited in the interlayer dielectric film, a TaN thin film is deposited inside the interconnection grooves, a seed layer of a Cu thin film is then deposited, the Cu thin film is embedded into the interconnection grooves and the interlayer contact holes by electrochemical deposition (electroplating), unnecessary interconnection material deposited on the other region than the interconnection grooves and the interlayer contact holes is removed by chemical mechanical polishing (CMP) to remain the interconnection material only in the interconnection grooves and the interlayer contact holes to thereby yield interconnections. In addition, a dual damascene interconnection process has been employed. In the dual damascene process, interlayer contact holes are fabricated during the formation of interconnection grooves, and the resulting interconnection grooves and interlayer contact holes are simultaneously filled with an interconnection material (metal) to thereby yield interconnections.

LSI interconnections have been down-sized more and more in accordance with the "road map". The resulting interconnection grooves and interlayer contact holes have decreasing widths and diameters, respectively, and have increasing aspect ratios (the ratio of the depth to the diameter) The process for fabricating Cu interconnections by electrochemical deposition, however, cannot satisfactorily embed the Cu interconnection material into grooves having minute dimensions. Thus, Cu cannot significantly perfectly embedded into via holes having high aspect ratios, and via holes and trenches having small diameters with interconnection width of 100 nm or less. Particularly, on the interconnection design rule of 0.1 µm or less, the via holes and trenches have further decreasing dimensions and further increasing aspect ratios, and the Cu-based material cannot significantly be embedded thereinto completely, which fails to provide reliable interconnections.

In addition to the above requirement (full embedment), such Cu-based interconnections must have a low electric resistivity $\rho$ equal to or less than about 3 to 4 µΩcm, sufficient reliability in contact (formation of reliable contacts) and sufficient reliability in interconnection. More specifically, the Cu-based interconnections must have resistance against breaks caused by stress migration (SM resistance) and resistance against breaks caused by electromigration (EM resistance). The conventional damascene interconnection process using electrochemical deposition cannot significantly provide Cu-based interconnections having properties equivalent to those of bulk Cu materials and fails to provide Cu-based interconnections satisfying all the above requirements.

Deposition of Cu interconnections by chemical vapor deposition (CVD) has been proposed as a possible candidate for perfectly embedding a Cu-based metal into interconnection grooves and interlayer contact holes. The deposition by CVD, however, cannot significantly yield high-purity interconections and brings about high cost. To avoid these problems, the present inventors have focused attention to improvement in the dual damascene interconnection process. The dual damascene process has increasingly employed mainly in customized ICs in Japan and will be further employed for fabricating Cu interconnections.

To improve the interconnection reliability, the use of Cu alloys instead of pure Cu as a material for Cu interconnections has been proposed. Such Cu alloys have a higher yield stress and provide higher adhesion between the interconnection and a barrier film such as a TaN thin film. Such proposed Cu alloy materials for the Cu interconnections are roughly classified as five groups, i.e., Cu—Ti alloys, Cu—Zr alloys, Cu—Sn alloys, Cu—Al alloys and Cu—Mg alloys. However, there is a limit in the type of Cu alloy materials for fabricating Cu-based interconnections in the dual damascene interconnection process using electrochemical deposition.

The disadvantages in the dual damascene interconnection process using electrochemical deposition may be effectively solved by sputtering a Cu alloy interconnection material, and subjecting the work to high temperature and high pressure reflowing. In the high temperature and high-pressure reflowing, a thin film 5 made of a Cu-based metal is deposited on a dielectric film 2 by sputtering, which dielectric film 2 has grooves such as a via hole (interconnection contact hole) 3 and a trench (interconnection groove) 6, so that the thin film 5 bridges the grooves (FIG. 1A); and a pressure (load) is isotropically applied vertically to the surface of the thin film to thereby press the Cu-based metal into the grooves (FIG. 1B). In this procedure, for example, hydrostatic pressure is applied at a pressure higher than normal pressure as described in JP-A No. 05-211238.

JP-A No. 2001-7050, for example, proposes a technique of depositing a metal material including copper, a copper alloy, silver, or a silver alloy so as to cover a dielectric film having holes and trenches over a substrate, and the holes and trenches are filled with the metal material as a result of anneal process, to thereby fabricate an interconnection film.

This technique, however, still has the following disadvantages. Specifically, the deposited Cu alloy thin film are not satisfactorily pressed into the holes and trenches by high temperature and high pressure reflowing unless the thin film is continuous and air-tight. In addition, the thin film of Cu-based metal cannot further be pressed into the holes and trenches if it deforms and breaks. Among such Cu-based thin films, those deposited by sputtering have lower reflowability (flowability at high temperatures) than Cu-based thin films deposited by electrochemical deposition. Thus, improvement in reflowability of such Cu-based thin films deposited by sputtering is an important issue in the damascene interconnection process.

In addition, considerably high temperature and high pressure are required for embedding such a Cu-based material into via holes and trenches having minute dimensions and having a high aspect ratio. Such high temperature and high pressure, however, cannot be significantly achieved actually. A demand has therefore been made to provide a technique for embedding such a Cu-based material into holes and trenches under relatively mild conditions.

SUMMARY OF THE INVENTION

Under these circumstances, a purpose of the present invention is to provide a method for easily fabricating Cu-based interconnections in a good yield by embedding a Cu-based metal, including not only pure Cu but also a Cu alloy, into grooves such as interconnection contact holes and contact trenches without clearance, and thereby easily fabricating Cu-based interconnections in a good yield by the damascene interconnection process in the production of semiconductor devices, which interconnections have a low electric resistivity, are dense, have high adhesive strength with a dielectric film and exhibit high reliability.

Specifically, the present invention provides a method for fabricating Cu-based interconnections in a semiconductor device, including the steps of depositing a thin film of Cu or Cu alloy on a dielectric film by sputtering, the dielectric film having at least one groove and being arranged on or above a substrate, and carrying out high temperature and high pressure treatment (high pressure anneal process) to thereby embed the Cu or Cu alloy into the at least one groove, in which the sputtering is carried out at a substrate temperature of −20° C. to 0° C. using, as a sputtering gas, a gaseous mixture containing hydrogen gas and an inert gas in a ratio in percentage of 5:95 to 20:80.

The high temperature and high pressure treatment is preferably carried out at a temperature of 400° C. to 600° C., at a pressure of 150 to 200 MPa for longer than 0 minute and equal to or shorter than 30 minutes. In addition or alternatively, the work after holding at high temperature and high pressure is preferably cooled to room temperature at a rate of 10° C./min or more in the high temperature and high pressure treatment. These configurations enalbe further reliable embedment of the Cu-based metal into the groove.

The present invention easily yields embedded Cu-based interconnections by embedding a Cu-based metal into grooves such as interconnection contact holes and contact trenches without clearance in the production of semiconductor devices such as silicon semiconductor devices. The resulting Cu-based interconnections have a low electric resistivity, are dense and have high adhesive strength with a dielectric film. This contributes to larger packing densities and higher properties of integrated circuits.

Further objects, features and advantages of the present invention will become apparent from the following description of the preferred embodiments with reference to the attached drawings.

BRIEF DESCRIPTION OF THE DRAWINGS

FIGS. 1A and 1B are schematic diagrams showing a method for fabricating interconnections according to the present invention;

DESCRIPTION OF THE PREFERRED EMBODIMENTS

Figure 2A:
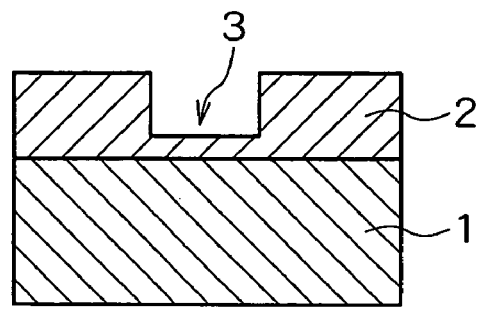
FIGS. 2A, 2B, 2C and 2D are schematic sectional views sequentially illustrating processes of a method for producing a semiconductor device.

Interconnects in a semiconductor device are fabricated by depositing a thin film of a Cu-based metal on a dielectric film by sputtering, which dielectric film has grooves such as interconnection contact holes and contact trenches and is arranged on a substrate, and filling the grooves with the Cu-based metal by high temperature and high pressure treatment. In this method, improvement in the reflowability of the Cu-based metal in the high temperature and high pressure treatment (high pressure annealing) is important to fill the grooves with the thin film of Cu-based metal without clearance and to thereby easily yield Cu-based interconnections in a semiconductor device which stably exhibit sufficient properties.

Effective methods to improve the reflowability of the Cu-based metal in the high temperature and high pressure treatment are:

(1) increasing the concentration of atomic vacancies in a Cu-based thin film to be subjected to high temperature and high pressure treatment; and
(2) allowing atomic vacancy and/or recovery of dislocation to form or occur at lower temperatures.

Among them, the method (1), i.e., introduction of atomic vacancy defect into the Cu-based thin film may be more effective. If the thin film has a large quantity of atomic vacancy defect, intense atomic diffusion occurs at temperatures at which the defect recovers (about 300° C. to 500° C.), which accelerates softening and deformation of the Cu-based metal.

Cu-based thin films generally have atomic vacancies in an amount larger than that in bulk Cu, since the bulk Cu has atomic vacancies in an amount corresponding to thermal equilibrium state, but such Cu-based thin films have atomic vacancies in an amount equal to or larger than the thermal equilibrium state. In particular, a Cu-based thin film deposited by electrochemical deposition has a large quantity of vacancies in such an amount to attain thermal equilibrium at around the melting point of the bulk Cu. In contrast, a Cu-based thin film deposited by sputtering has atomic vacancies in an amount smaller than that in the Cu-based thin film deposited by electrochemical deposition, and this may result in lower reflowability.

The present inventers made investigations on conditions for film deposition by sputtering so as to deposit a thin film of a Cu-based metal having a large quantity of atomic vacancies and to thereby accelerate softening and deformation of the Cu-based metal by utilizing intense atomic diffusion at temperatures at which the atomic vacancy defect recovers (about 300° C. to 500° C.). As a result, they have found that selecting the sputtering gas and controlling the substrate temperature as follows are effective to achieve the above purpose.

Sputtering Gas:

The sputtering gas for use in the present invention should be a gaseous mixture containing hydrogen gas and an inert gas in a ratio in percentage of 5:95 to 20:80.

When a Cu-based thin film is deposited by sputtering in an atmosphere of a gaseous mixture containing Ar and $H_2$, $H_2$ in the atmospheric gas is once taken into the Cu-based thin film. Cu, however, does not have capability of hydrogen occlusion, and $H_2$ easily diffuses through the Cu-based thin film and escapes therefrom. Holes in the thin film from which $H_2$ has escaped constitute the atomic vacancies. This effect is not obtained in the case of using pure Ar gas as a sputtering gas. A gaseous mixture of $H_2$ and an inert gas such as Ar gas is therefore used as a sputtering gas in the present invention.

The molar fraction of $H_2$ in the gaseous mixture of $H_2$ and an inert gas should be 5% or more and is preferably 10% or more to form a sufficient quantity of the atomic vacancy to thereby accelerate softening and deformation of the Cu-based metal by the intense atomic diffusion. In contrast, the molar fraction of $H_2$ in the gaseous mixture should be 20% or less. An excessively large quantity of $H_2$ in the gaseous mixture causes a relatively small quantity of the inert gas and a decreased apparent molecular weight of the gaseous mixture and invites decreased productivity of the Cu-based interconnections (decreased deposition rate of Cu films).

Substrate Temperature:

The temperature of substrate should be −20° C. to 0° C. When a Cu-based thin film is deposited by sputtering at such a low substrate temperature, Cu particles (atoms) deposited on the substrate (or a dielectric film arranged thereon) are resistant to migration on the substrate and are deposited at random without alignment. Consequently, a large quantity of the atomic vacancy forms in the deposited Cu-based thin film.

The substrate temperature is set at 0° C. or below in the present invention, in order to yield a sufficient quantity of atomic vacancy utilizing this phenomenon. In contrast, the lower limit of the substrate temperature is set at −20° C. This is because there is no suitable refrigerant to attain further lower temperatures, and the productivity may decrease at such lower substrate temperatures typically due to dewing. The substrate temperature in the above-specified range may be achieved, for example, by circulating a refrigerant such as "Fluorinert" (registered trademark; available from Sumitomo 3M Limited) cooled by a chiller unit in a substrate holder.

The other conditions in the sputtering are not specifically limited. For example, the following sputtering gas pressure, discharge power density, and anode-cathode distance may be selected. In this connection, DC magnetron sputtering is preferably employed as the sputtering process for high deposition efficiency.

Sputtering gas pressure: 0.5 to 1.0 mTorr
Discharge power density: 3 to 10 W/cm$^2$
Anode-cathode distance: 40 to 65 mm The thickness of the Cu-based thin film to be deposited by sputtering is determined according to the device design, is not specifically limited but must be such a thickness as to bridge via holes and trenches completely. The composition of the Cu-based metal to be deposited by sputtering is not specifically limited, as long as the resulting thin film has an appropriate electric conductivity. Examples of the Cu-based metal are pure Cu, the above-mentioned five types of alloys including Cu—Ti alloys, Cu—Zr alloys, Cu—Sn alloys, Cu—Al alloys and Cu—Mg alloys, as well as any other Cu-based alloys.

According to the present invention, conditions for the high temperature and high pressure treatment after sputtering are preferably controlled, in addition to the control of the sputtering conditions. This increases the reflowability of the Cu-based metal at high temperatures, enables more reliable embeding (filling) of the Cu-based thin film in grooves and yields Cu-based interconnections for a high-quality semiconductor device. Preferred conditions for the high temperature and high pressure treatment will be described in detail below.

Process temperature: 400° C. to 600° C.

The process temperature is preferably 400° C. or higher for higher reflowability of the Cu-based thin film at high temperatures. It is, however, preferably 600° C. or lower, since an excessively high process temperature may cause breakdown or deterioration of properties of the dielectric film comprising a low-k material used in combination with Cu-based interconnections.

Process pressure: 150 to 200 MPa

A pressure of 150 MPa or more is preferably applied for higher reflowability of the Cu-based thin film at high temperatures. The pressure is, however, preferably 200 MPa or less, since an excessively high process pressure may cause breakdown or deterioration of properties of a dielectric film comprising a low-k material used in combination with Cu-based interconnections, as in an excessively high process temperature.

Process time (holding time at high temperature and high pressure): longer than 0 minute and equal to or shorter than 30 minutes The process time herein is the time period for holding the work at high temperature and high pressure and may be determined according to, for example, the process pressure and the process temperature. Holding the work for 30 minutes is adequate to increase the reflowability of the Cu-based thin film at high temperatures and to fill grooves with the Cu-based metal without clearance.

Cooling rate after holding the work at high temperature and high pressure: 10° C./min or more The cooling rate after holding the work at high temperature and high pressure is preferably controlled in the high temperature and high pressure treatment, for perfect filling of Cu-based interconnections in grooves. The pressure is applied and removed, and the temperature is raised and lowered proportionally to time in the high temperature and high pressure treatment. Among such parameters, the cooling rate (temperature falling rate) significantly affects the filling performance of the Cu-based metal. If the cooling rate is low, a Cu-based metal once embedded in the grooves such as via holes and trenches as a result of heating and pressurization under the above-mentioned conditions escapes from the via holes and trenches (siphoning phenomenon). This phenomenon is probably caused by stress migration (SM) of the Cu-based thin film, in which tensile stress acts upon a blanket Cu-based thin film remaining on the top of grooves such as via holes and trenches during cooling, and the Cu-based metal once embedded in the grooves is drawn out from the grooves by creep deformation mechanism with the tensile stress as a driving force.

Consequently, cooling the work at a high rate after holding at high temperature and high pressure is effective to prevent the siphoning phenomenon to thereby enable perfect filling of the Cu-based interconnections. The cooling rate after holding the work at high temperature and high pressure is therefore preferably set at 10° C./min or more.

As is described above, a Cu-based thin film is deposited by sputtering under the above-specified conditions on grooves such as interconnection contact holes and interconnection grooves arranged over a substrate (or a dielectric film arranged thereon) so as to bridge the openings of the grooves. The Cu-based thin film is then subjected to high temperature and high pressure treatment, preferably under the above-specified conditions. Thus, the resulting semiconductor device has perfectly embedded Cu-based interconnections having a low electric resistivity, being compact or dense, having a high adhesive strength with a dielectric film and exhibiting high reliability. The semiconductor device keeps its high quality over a long time.

The other constitutional components of a semiconductor device than the Cu-based interconnections are not specifically limited in their production methods in the present invention. Specifically, a method for depositing a dielectric film over a substrate as a matrix for the Cu-based metal thin film, and a method for fabricating trenches and contact holes for embedded interconnection in the dielectric film are not specifically limited, and any suitable known methods can be utilized. Examples of the material for the dielectric film are silicon oxide, silicon nitride, boro-silicate glass (BSG), phospho-silicate glass (PSG) and boro-phospho-silicate glass (BPSG).

The dielectric film having such embedded interconnection grooves or contact holes may further have a barrier layer deposited thereon, as shown later in the examples and FIGS. 2A through 2D. The barrier layer is a film for preventing diffusion of Cu in a Cu-based metal to be deposited on the barrier layer into the dielectric film. The barrier film may be a film of, for example, TaN or TiN. In the after-mentioned examples, tantalum nitride (TaN) is deposited as a barrier layer. TaN, a ceramic, is substantially inert to such a Cu-based metal, and a film of TaN is resistant against diffusion of a Cu-based metal thereinto even in a process at high temperatures of, for example, about 700° C. The barrier layer can be deposited on the dielectric film by any method not specifically limited, such as sputtering including DC magnetron sputtering, and chemical vapor deposition (CVD).

The thickness of the deposited barrier layer is not specifically limited, as long as it is such a thickness as to prevent the Cu-based metal from diffusing into the dielectric film and may for example be about 5 to about 50 nm. An excessively thick barrier layer, however, causes an increased effective electric resistivity of the interconnections and is not preferred.

According to the present invention, a thin film of a Cu-based metal is deposited by sputtering under the above-specified conditions, and is then subjected to high temperature and high pressure treatment. Other detailed processe steps are not specifically limited. For example, it is possible to repeat a stacking process including the following Processes A, B and C arbitrary times and to carry out the high temperature and high pressure treatment after Process C in each cycle or at least after the final Process C. More specifically, when the stacking process is carried out once to yield a single layer interconnection, the high temperature and high pressure treatment under the above conditions is carried out after Process C. When the stacking process is carried out two or more times to yield multilayer interconnections, the high temperature and high-pressure treatment under the above conditions may be carried out after each Process C in each cycle, or may be carried out after the final Process C after repeating the stacking process including Processes A, B and C.

Process A: A dielectric film having embedded interconnection grooves or contact holes is deposited on a semiconductor substrate.

Process B: A barrier layer is deposited on the dielectric film.

Process C: A film of Cu-based metal is deposited on the barrier layer.

Thus, embedded interconnections are fabricated or deposited on the semiconductor substrate after the high temperature and high-pressure treatment and subsequent polishing of the surface of the work. The polishing procedure is not specifically limited, and any suitable polishing procedure employed in semiconductor fabrication, such as chemical mechanical polishing, can be employed.

The present invention will be illustrated in further detail with reference to several experimental examples below which by no means limit the scope of the present invention. Any modification of such examples without deviating the scope of the present invention is within the technical range of the present invention.

EXAMPLE 1

Figure 2B:
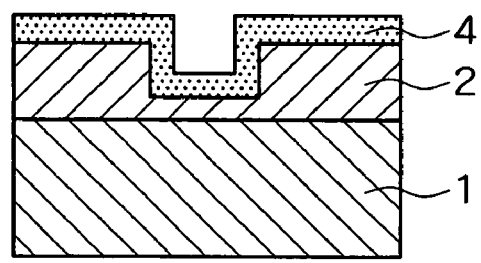

Interconnects were formed in a semiconductor device sequentially in accordance with the processes shown in the schematic sectional views of FIGS. 2A, 2B, 2C and 2D. Specifically, a large number of via hole 3 having a diameter of 0.18 μm and a pitch of 450 nm was formed on a dielectric film (TEOS film: SiOF film) 2 which had been deposited on an 8-inch silicon wafer 1 to thereby yield a test element group (TEG) (FIG. 2A). In this connection, only one via hole 3 is illustrated in FIG. 2A. A thin film of TaN was deposited on a surface of TEG by reactive sputtering in an atmosphere of Ar and $N_2$ gas to thereby deposit a barrier layer (TaN thin film) 4 having a thickness of 50 nm on the bottom and side of the via hole 3 (FIG. 2B).

Figure 2C:
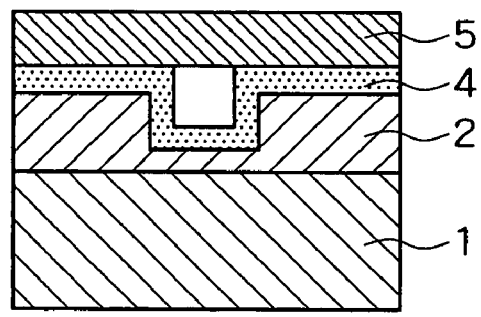

Next, a pure Cu thin film 5 having a thickness of 7500 angstroms was deposited on the TEG by sputtering in an atmosphere of Ar gas or in an atmosphere of a gaseous mixture of Ar and $H_2$ so that an opening of the via hole 3 was fully bridged by the Cu thin film 5 (FIG. 2C). The deposition of the Cu thin film 5 was carried out at the following constant sputtering gas pressure, discharge power density and substrate temperature while using pure Ar gas or a gaseous mixture of Ar and $H_2$ with a varying $H_2$ molar fraction of 5% to 30% as a sputtering gas.

Sputtering gas pressure: $2 \times 10^{-3}$ Torr

Discharge power density: 3.5 W/cm$^2$

Substrate temperature: room temperature or −20° C.

Figure 2D:
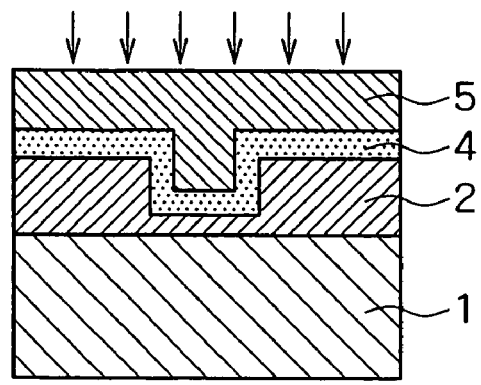

The resulting TEG having the Cu thin film 5 bridging the opening of the via hole 3 was subjected to high temperature and high pressure treatment. More specifically, the high temperature and high pressure treatment was carried out using a high pressure annealing unit "HiPA HIP mini-820" available from Kobe Steel Ltd. at a temperature of 450° C.

and a pressure of 150 MPa for 30 minutes (FIG. 2D). The pressure herein was applied with Ar gas.

Cross sections of the samples were observed to find that Cu was embedded in the via hole in samples after the high temperature and high pressure treatment, and that Cu was not substantially embedded in the via hole in samples which had the opening of the via hole fully bridged by the Cu thin film but were not subjected to the high temperature and high pressure treatment.

Next, TEG after high temperature and high-pressure treatment was processed with a focused ion beam (FIB) unit so that cross sections of fifteen or more via holes in each sample were exposed. The cross sections of the via holes were observed on a scanning ion microscope (SIM) of the FIB unit to determine how Cu was embedded in the via holes.

How Cu was embedded in the via holes was quantitatively determined in the following manner. The sectional SIM images of the via holes were analyzed, and a filling percentage of Cu (%) was determined as the ratio of the sectional area of embedded Cu-based metal to the sectional area of the via hole. The average of the percentages of embedded Cu of the fifteen via holes was determined as an evaluation index.

Figure 3:
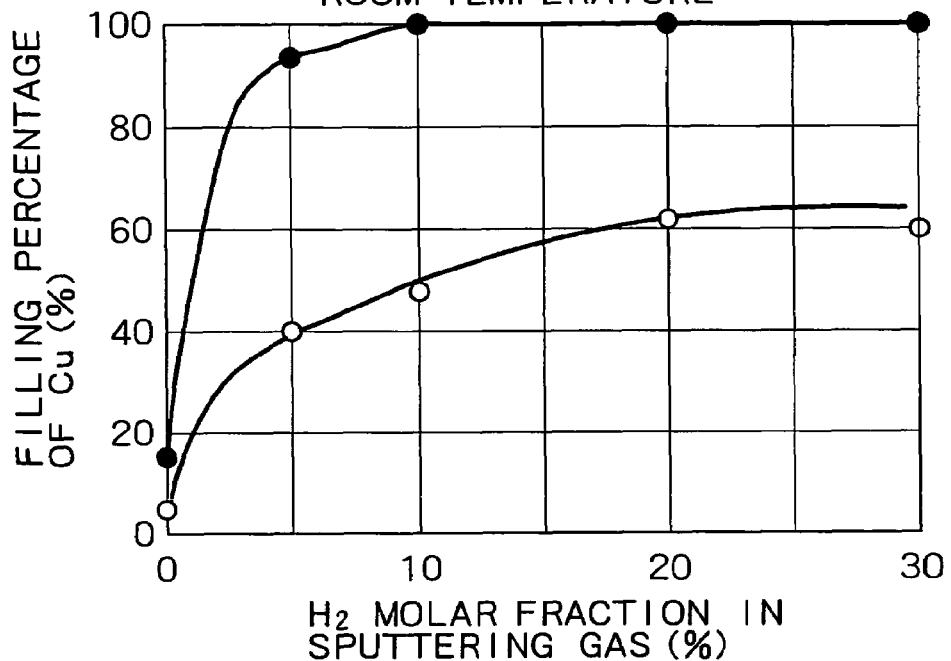
FIG. 3 is a graph showing the relationship between the filling percentage of Cu and the $H_2$ molar fraction in sputtering gas in film deposition of Example 1.

The test results are shown in FIG. 3 as the relationship between the filling percentage of Cu and the $H_2$ molar fraction in the gaseous mixture of Ar and $H_2$. FIG. 3 shows that, at a low substrate temperature, Cu can be satisfactorily embedded in the via holes when a gaseous mixture of Ar and $H_2$ was used as the sputtering gas than in the case where pure Ar gas was used as the sputtering gas, and that Cu can be substantially perfectly embedded in the via holes at a $H_2$ molar fraction in the gaseous mixture of 5% or more. A $H_2$ molar fraction exceeding 20% also yields a high filling percentage of Cu (FIG. 3), but causes a decreased sputtering yield upon film deposition.

EXAMPLE 2

A barrier layer (TaN thin film) 4 having a thickness of 50 nm was deposited on the bottom and side of a via hole 3 of a TEG by the procedure of Example 1, and a pure Cu thin film 5 having a thickness of 7500 angstroms was deposited thereon by sputtering so that the Cu thin film 5 fully bridged the opening of the via hole 3. The Cu thin film 5 was deposited at the following constant sputtering gas pressure and discharge power density using the following sputtering gas while varying the substrate temperature in a range from −25° C. to 200° C.

Sputtering gas pressure: $2\times10^{-3}$ Torr

Sputtering gas: Ar–20% $H_2$

Discharge power density: 3.5 W/cm²

Figure 4:
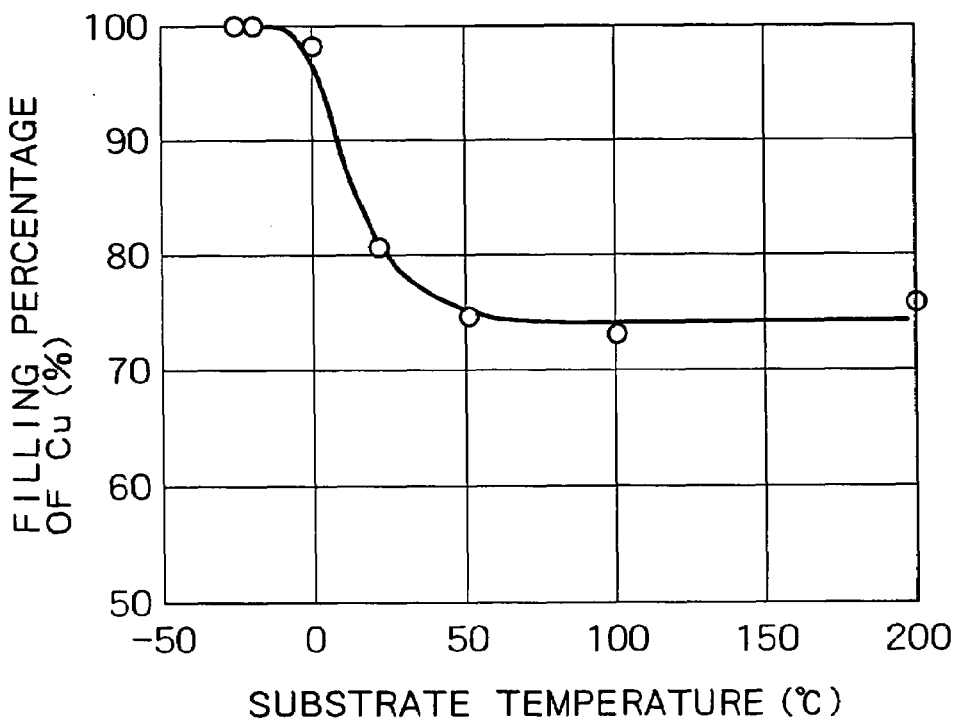
FIG. 4 is a graph showing the relationship between the filling percentage of Cu and the substrate temperature in film deposition in Example 2.

Next, the TEG was subjected to high temperature and high pressure treatment by the procedure of Example 1, and how Cu was embedded in the via hole 3 was determined. The results are shown in FIG. 4. FIG. 4 is a graph showing the relationship between the filling percentage of Cu and the substrate temperature in deposition of the pure Cu thin film. FIG. 4 shows that the filling percentage of Cu varies depending on the substrate temperature in deposition by sputtering and increases with a decreasing substrate temperature in sputtering. In other word, Cu is more satisfactorily embedded with a decreasing substrate temperature. In particular, the filling percentage of Cu markedly increases and Cu is substantially perfectly embedded in the via hole 3 at a substrate temperature of 0° C. or below.

EXAMPLE 3

A barrier layer (TaN thin film) 4 having a thickness of 50 nm was deposited on the bottom and side of a via hole 3 of a TEG by the procedure of Example 1, and a pure Cu thin film 5 having a thickness of 7500 angstroms or a Cu alloy thin film 5 having a thickness of 7500 angstroms was deposited thereon by sputtering so that the thin film 5 fully bridged the opening of the via hole 3. In this procedure, the pure Cu thin film 5 was deposited with a pure Cu target, and the Cu alloy thin film 5 was deposited with a Cu alloy target containing 2.0 atomic percent of Dy. The sputtering gas pressure, type of sputtering gas, discharge power density and substrate temperature are as shown in Table 1 (Deposition Condition 1 or Deposition Condition 2).

TABLE 1

| Deposition parameter | Condition 1 | Condition 2 |
| --- | --- | --- |
| Sputtering gas pressure (Torr) | $2 \times 10^{-3}$ | $2 \times 10^{-3}$ |
| Type of sputtering gas | pure Ar | Ar-20% $H_2$ |
| Discharge power density (W/cm²) | 3.5 | 3.5 |
| Substrate temperature (° C.) | room temperature | −20 |

The TEG was then subjected to high temperature and high pressure treatment by the procedure of Example 1, and the filling percentage of Cu of TEG after the process was determined. The results are shown in Table 2.

TABLE 2

|  | Condition 1 | Condition 2 |
| --- | --- | --- |
| Pure Cu | 11.7% | 100% |
| Cu-2.0 at. % Dy alloy | 49.7% | 97.8% |

Table 2 shows that Cu is slightly embedded in the via hole 3 as a result of high temperature and high pressure treatment when the pure Cu thin film is deposited under the conventional deposition condition, i.e., Deposition Condition 1, but that Cu is perfectly embedded when the pure Cu thin film is deposited under Deposition Condition 2 satisfying the requirements in the present invention. Likewise, Cu is not so much embedded in the via hole 3 as a result of high temperature and high-pressure treatment when the Cu—Dy alloy thin film is deposited under Deposition Condition 1, but that Cu is substantially perfectly embedded when the thin film is deposited under Deposition Condition 2.

When deposited under Deposition Condition 1, the Cu—Dy alloy thin film has a higher filling percentage of Cu than the pure Cu thin film. This is probably because the Cu—Dy alloy thin film has an average (crystal) grain size smaller than the pure Cu, and yields grain growth less than that of the pure Cu thin film; and the resulting Cu—Dy alloy thin film bears a large quantity of grain boundaries even at high temperatures and exhibits higher flowability at high temperatures (reflowability) due to grain boundary sliding.

EXAMPLE 4

A barrier layer (TaN thin film) 4 having a thickness of 50 nm was deposited on the bottom and side of a via hole 3 of a TEG by the procedure of Example 1, and a pure Cu thin film 5 having a thickness of 7500 angstroms was deposited thereon by sputtering so that the Cu thin film 5 fully bridged the opening of the via hole 3. The Cu thin film 5 was deposited at the following constant sputtering gas pressure, discharge power density and substrate temperature using the following sputtering gas.

Sputtering gas pressure: $2\times10^{-3}$ Torr
Sputtering gas: Ar–20% $H_2$
Discharge power density: 3.5 W/cm$^2$
Substrate temperature: –20° C.

The TEG deposited the Cu thin film was subjected to high temperature and high pressure treatment by the procedure of Example 1, except for varying the temperature in a range from room temperature to 500° C. and the pressure in a range from 0 to 200 MPa. The filling percentage of Cu of the TEG after the high temperature and high pressure treatment was determined. The results are shown in Table 3, in which the data are filling percentages of Cu (%) unless otherwise specified.

TABLE 3

| | | Temperature (° C.) | | | | | |
|---|---|---|---|---|---|---|---|
| | | Room temperature | 300 | 350 | 400 | 450 | 500 |
| Pressure (MPa) | 0 | 0 | 0 | 0 | 0 | 0 | 0 |
| | 50 | 0 | 0 | 0 | 0 | 0 | 0 |
| | 100 | 0 | 0 | 51 | 70 | 72 | 74 |
| | 150 | 0 | 0 | 98 | 100 | 100 | 100 |
| | 200 | 0 | 0 | 100 | 100 | 100 | 100 |

Table 3 shows that, when a pure Cu thin film deposited under the condition according to the present invention is subjected to high temperature and high pressure treatment, Cu can be perfectly embedded in the via hole 3 by carrying out the high temperature and high pressure treatment at a temperature of 350° C. or higher, preferably 400° C. or higher, and a pressure of 150 MPa or more.

As a comparative example, a Cu thin film was deposited under the following conventional condition and was then subjected to high temperature and high pressure treatment under the same condition as above in the following manner.

A barrier layer (TaN thin film) 4 having a thickness of 50 nm was deposited on the bottom and side of a via hole 3 of a TEG by the procedure of Example 1, and a pure Cu thin film 5 having a thickness of 7500 angstroms was deposited thereon by sputtering so that the Cu thin film 5 fully bridged the opening of the via hole 3. The Cu thin film 5 was deposited at the following constant sputtering gas pressure, discharge power density and substrate temperature using the following sputtering gas. The following deposition conditions are conventional conditions generally employed in sputtering of Cu thin films.

Sputtering gas pressure: $2\times10^{-3}$ Torr
Sputtering gas: pure Ar
Discharge power density: 3.5 W/cm$^2$
Substrate temperature: room temperature The TEG deposited the Cu thin film was subjected to high temperature and high pressure treatment by the procedure of Example 1, except for varying the temperature in a range from room temperature to 500° C. and the pressure in a range from 0 to 200 MPa. The filling percentage of Cu of the TEG after the high temperature and high pressure treatment was determined. The results are shown in Table 4, in which the data are filling percentages of Cu (%) unless otherwise specified.

TABLE 4

| | | Temperature (° C.) | | | | | |
|---|---|---|---|---|---|---|---|
| | | Room temperature | 300 | 350 | 400 | 450 | 500 |
| Pressure (MPa) | 0 | 0 | 0 | 0 | 0 | 0 | 0 |
| | 50 | 0 | 0 | 0 | 0 | 0 | 0 |
| | 100 | 0 | 0 | 0 | 0 | 0 | 3 |
| | 150 | 0 | 0 | 0 | 0 | 11 | 62 |
| | 200 | 0 | 0 | 0 | 7 | 71 | 100 |

Table 4 shows that a pure Cu thin film deposited under the condition out of the requirements according to the present invention must be subjected to high temperature and high-pressure treatment at a temperature of 500° C. or higher and a pressure of 200 MPa or more in order to fully bury Cu in the via hole, and that the Cu thin film requires much more severe conditions, i.e., a higher temperature and a higher pressure, in the high temperature and high pressure treatment than Cu thin films deposited under the above-specified conditions.

EXAMPLE 5

A barrier layer (TaN thin film) 4 having a thickness of 50 nm was deposited on the bottom and side of a via hole 3 of a TEG by the procedure of Example 1, and a pure Cu thin film 5 having a thickness of 7500 angstroms was deposited thereon by sputtering so that the Cu thin film 5 fully bridged the opening of the via hole 3.

The Cu thin film 5 was deposited at the following constant sputtering gas pressure, discharge power density, and substrate temperature using the following sputtering gas.

Sputtering gas pressure: $2\times10^{-3}$ Torr
Sputtering gas: Ar–20% $H_2$
Discharge power density: 3.5 W/cm$^2$
Substrate temperature: –20° C.

Figure 5:
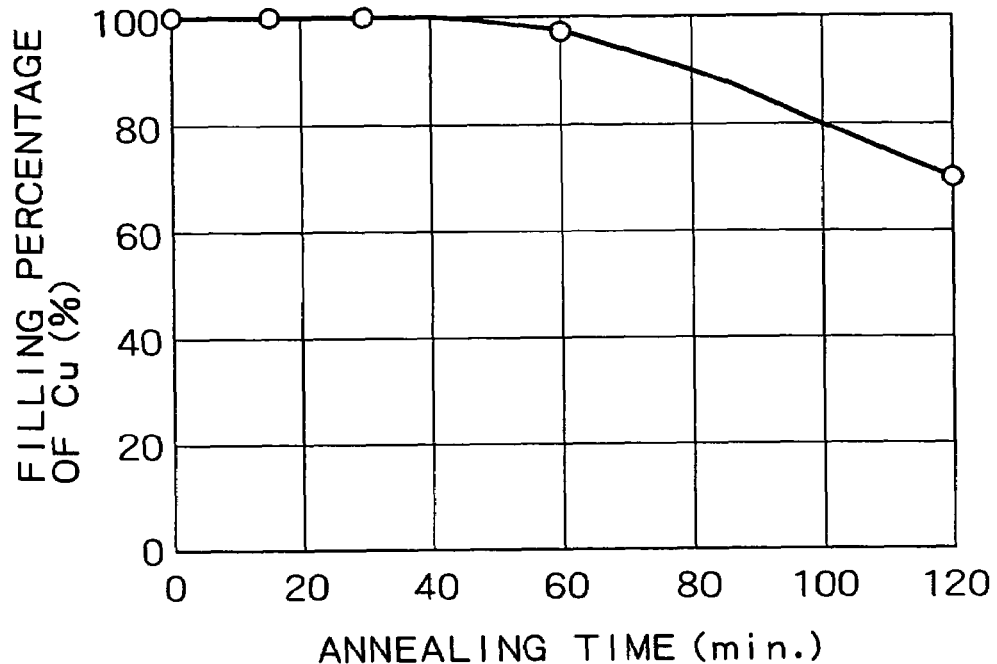
FIG. 5 is a graph showing the relationship between the filling percentage of Cu and the holding time (annealing time) in a high temperature and high pressure treatment in Example 5.

The TEG deposited the Cu thin film was subjected to high temperature and high pressure treatment by the procedure of Example 1, except that the process was carried out at a temperature of 450° C. and a pressure of 150 MPa for a varying time ranging from 0 minute to 120 minutes. The filling percentage of Cu of the TEG after the high temperature and high pressure treatment was determined. The results are shown in FIG. 5. FIG. 5 shows that when a Cu thin film deposited under the condition according to the present invention is subjected to high temperature and high pressure treatment under above condition, Cu can be perfectly embedded in the via hole by carrying out the high temperature and high pressure treatment for a time period of 30 minutes or less.

EXAMPLE 6

A barrier layer (TaN thin film) 4 having a thickness of 50 nm was deposited on the bottom and side of a via hole 3 of a TEG by the procedure of Example 1, and a pure Cu thin film 5 having a thickness of 7500 angstroms was deposited thereon by sputtering so that the Cu thin film 5 fully bridged the opening of the via hole 3. The Cu thin film 5 was deposited at the following constant sputtering gas pressure, discharge power density and substrate temperature using the following sputtering gas.

Sputtering gas pressure: $2\times10^{-3}$ Torr
Sputtering gas: Ar–20% $H_2$
Discharge power density: 3.5 W/cm$^2$
Substrate temperature: –20° C.

Figure 6:
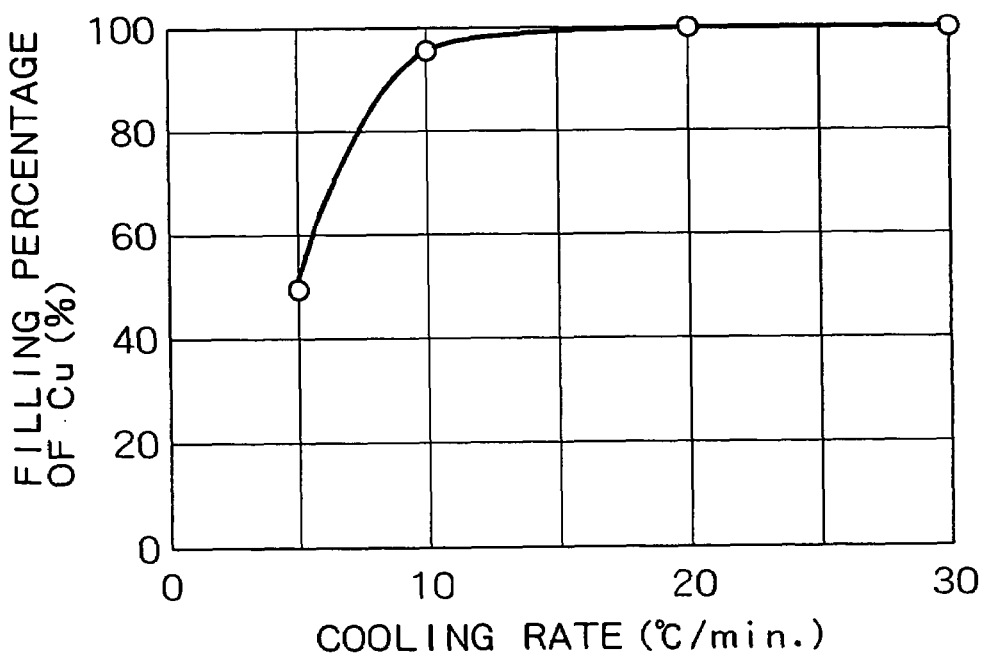
FIG. 6 is a graph showing the relationship between the filling percentage of Cu and the cooling rate after holding the work at high temperature and high pressure in Example 6.

The TEG was subjected to high temperature and high pressure treatment by the procedure of Example 1, except for varying a cooling rate in a range from 5 to 30° C./min after holding the work at a temperature of 450° C. and a pressure of 150 MPa. The filling percentage of Cu of the TEG after the high temperature and high pressure treatment was determined. The results are shown in FIG. 6. FIG. 6 shows that Cu can be perfectly embedded in the via hole at a cooling rate of 10° C./min or more but the filling percentage of Cu decreases at a cooling rate less than 10° C./min.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A method for fabricating Cu-based interconnections in a semiconductor device, comprising the steps of:
    depositing a thin film of Cu or Cu alloy on a dielectric film by sputtering, the dielectric film having trenches and/or via holes and being arranged on or above a substrate; and
    carrying out high temperature and high pressure treatment to thereby embed the Cu or Cu alloy into the trenches and/or via holes,
    wherein the step of carrying out high temperature and high pressure treatment comprises cooling the work at a rate of 10° C./min or more after holding the work at high temperature and high pressure so that the filling percentage of the Cu or Cu alloy in the trenches and/or via holes is at least 95%; and
    wherein the sputtering is carried out under the following conditions:
        sputtering gas: a gaseous mixture containing hydrogen gas and an inert gas in a ratio in percentage of 5:95 to 20:80
        substrate temperature: −20° C. to 0° C.

2. The method according to claim 1, wherein the step of carrying out high temperature and high pressure treatment comprises holding the work under the following conditions:
    temperature: 400° C. to 600° C.
    pressure: 150 to 200 MPa
    time: longer than 0 minute and equal to or shorter than 30 minutes.

3. The method according to claim 1, wherein the thin film is a Cu alloy selected from the group consisting of Cu—Ti alloys, Cu—Zr alloys, Cu—Sn alloys, Cu—Al alloys and Cu—Mg alloys.

4. The method according to claim 1, wherein the dielectric film comprises at least one selected from the group consisting of silicon oxide, silicon nitride, boro-silicate glass, phospho-silicate glass and boro-phospho-silicate glass.

5. The method according to claim 1, further comprising depositing a barrier layer on the dielectric layer before depositing the thin film of Cu or Cu alloy on the dielectric film.

6. The method according to claim 5, wherein the barrier layer comprises TaN or TiN.

* * * * *

UNITED STATES PATENT AND TRADEMARK OFFICE
CERTIFICATE OF CORRECTION

PATENT NO. : 7,335,596 B2  
APPLICATION NO. : 11/157862  
DATED : February 26, 2008  
INVENTOR(S) : Onishi et al.

It is certified that error appears in the above-identified patent and that said Letters Patent is hereby corrected as shown below:

On the title page, Item (73), the Assignee information is incorrect. Item (73) should read:

-- (73) Assignee: Kabushiki Kaisha Kobe Seiko Sho (Kobe Steel, Ltd.), Kobe-shi (JP) --

Signed and Sealed this

Twenty-fourth Day of June, 2008

JON W. DUDAS  
*Director of the United States Patent and Trademark Office*